United States Patent [19]

Blackledge

[11] 4,025,723
[45] May 24, 1977

[54] REAL TIME AMPLITUDE CONTROL OF ELECTRICAL WAVES

[75] Inventor: Vernon O. Blackledge, Scottsdale, Ariz.

[73] Assignee: Hearing Health Group, Inc., Scottsdale, Ariz.

[22] Filed: July 7, 1975

[21] Appl. No.: 593,306

[52] U.S. Cl. .......................... 179/1 VL; 179/107 R; 328/170; 333/14

[51] Int. Cl.² ...................... H03G 3/00; H03G 7/00; H04R 25/00

[58] Field of Search ............. 179/1 VL, 1 P, 107 R, 179/107 FD; 333/14, 28 T; 360/24, 25, 65; 325/46, 65, 474, 397; 307/264; 328/163, 170, 143, 144, 145; 330/29, 31, 84, 124 R, 126, 150

[56] References Cited
UNITED STATES PATENTS

| | | | |
|---|---|---|---|
| 1,550,684 | 4/1925 | Espenschied | 328/163 |
| 2,287,077 | 6/1942 | Abraham | 333/14 |
| 2,340,364 | 2/1944 | Bedford | 330/126 |
| 3,180,936 | 4/1965 | Schroeder | 179/1 P |
| 3,229,049 | 1/1966 | Goldberg | 179/107 FD |
| 3,769,611 | 10/1973 | Scaggs | 333/14 |
| 3,784,750 | 1/1974 | Stearns et al. | 179/107 FD |

Primary Examiner—George G. Stellar
Attorney, Agent, or Firm—Simon Yaffee

[57] ABSTRACT

This invention relates to real time control either in compression or expansion of the amplitude of electrical waves and more specifically to a real time expandor or compressor of the amplitude of sound waves. In general a source of waves which may be the electrical equivalent of a sound including continuous discourse is applied to a plurality of first filters whose output is connected to respective power circuits, that is, circuits that produce at its output a wave whose amplitude is a power, either greater or less than one, of the amplitude of the wave applied to its input. The outputs of the power circuits are applied to respective second filters which are similar to the filters connected to the input of the power circuits and the output of the second filters is connected to a utilization device. Amplifiers may be connected where needed. The electrical wave applied to the utilization device is a real time compressed or expanded version of the wave applied to the first filters depending on whether the power is less than or greater than one, since the compression or expansion takes place in the power circuits and there is no delay in them.

4 Claims, 3 Drawing Figures

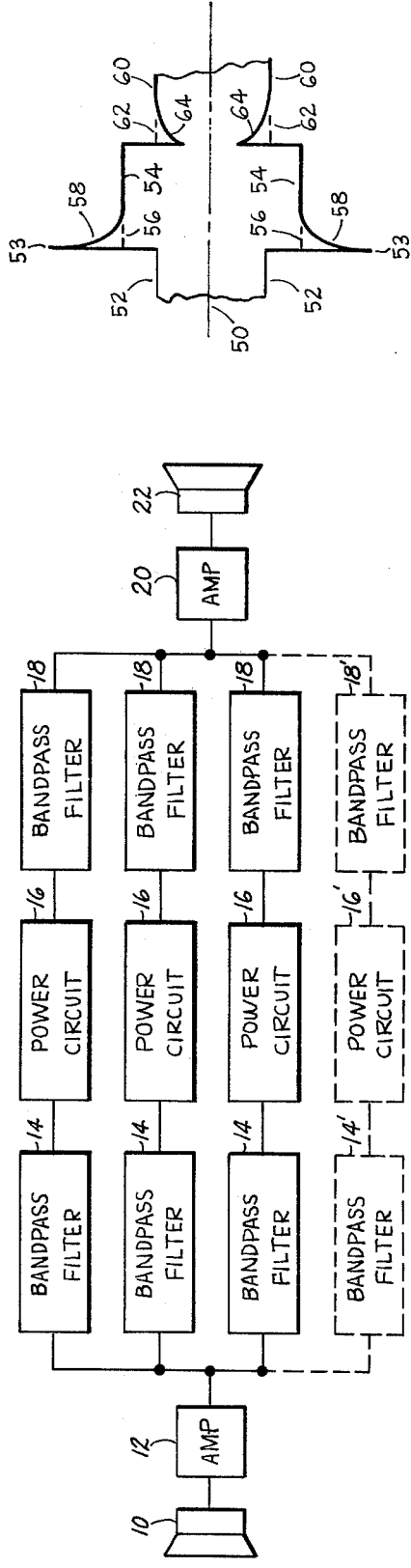
*FIG. 1*
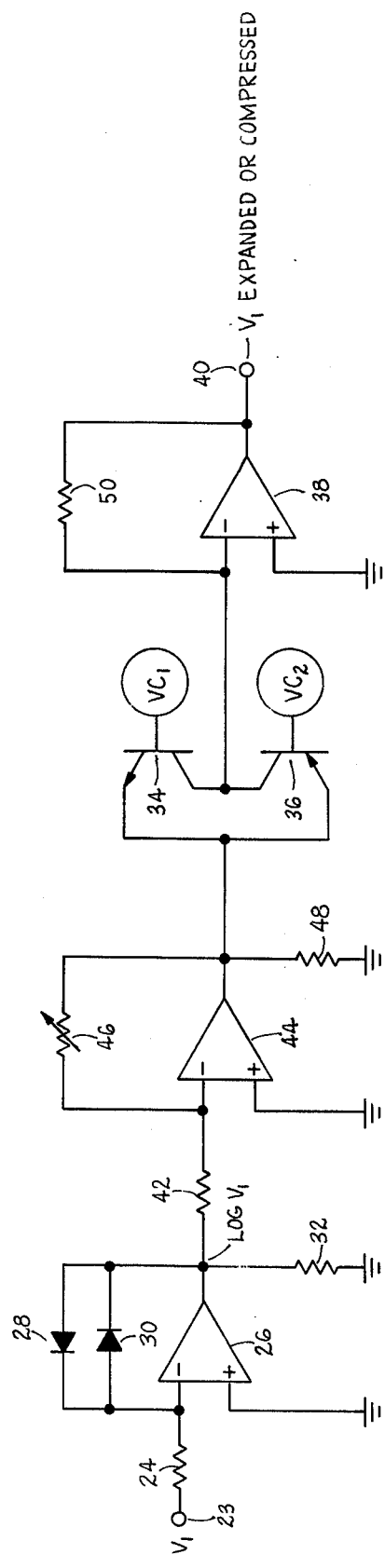
*FIG. 3*
*FIG. 2*

REAL TIME AMPLITUDE CONTROL OF ELECTRICAL WAVES

BACKGROUND OF THE INVENTION

This invention relates in general to means for providing real time control of the amplitude of an electric wave and more specifically to means for providing real time expansion or compression of the amplitude of an electric wave which corresponds to a sound wave such as continuous discourse.

Wave expanders or compressors are well known and are generally called automatic gain control (a.g.c.) or automatic volume control (a.v.c.) circuits. Such known circuits generally store a portion of a wave whose volume is to be controlled over a short period of time and average the wave over a short period of time such as a millisecond. The average voltage so produced is used to control the volume of an electrical wave that comes along after the average voltage has been produced. Therefore, such known volume control devices are not real time devices. That is, they control the volume of an existent wave in accordance with the average amplitude of previously existing waves. Such known volume control devices therefore, may distort the electrical wave so that the listener to the sound to which the electrical wave is finally converted may not be able to understand the sound although he may have no trouble hearing it. For example, plosive sounds like the t, p sounds may be compressed in accordance with the amplitude of a loud sound preceeding them, whereby the plosive sound may lose much of its plosive quality, thereby making these sounds hard to understand. Furthermore, soft sounds often follow louder sounds in normal speech and when the soft sound is compressed in accordance with the amplitude of an immediately preceeding loud sound, as is done in known compressors, the soft sound may be lost entirely. Therefore, where a known compressor is incorporated in a hearing aid for persons having impaired hearing, or where a known compressor is incorporated in a loudspeaker, which is also a hearing aid, for projecting sound into an area where there is background noise, the known sound compressor detracts from the readability of the sound. That is, due to the action of the known sound compressor, the sound may be heard but may not be intelligible to persons having impaired hearing or to persons who are in an area where there are background noises. In summary, while known compressors do compress the range of amplitude of sounds on which they operate, the compressors compress the amplitude range of all sounds as controlled by the stored wave. It has been found advantageous, as will be more specifically noted below, to compress or expand the amplitude of sounds without using the controlling action of previous stored amplitude, which cannot be done by presently known volume controls, to realize real time amplitude compression or expansion.

OBJECTS OF THE INVENTION

It is therefore an object of this invention to provide a real time volume control that compresses or expands the amplitude of an electrical wave in accordance with the amplitude of the wave that is being compressed or expanded and not in accordance with a previous wave or waves that no longer exist or the average of such waves.

It is a further object of this invention to provide a real time compressor that compresses the amplitude of an electrical wave in accordance with the amplitude of the wave that is being compressed and not in accordance with a previous wave or waves that no longer exist or the average of such waves.

It is still a further object of this invention to provide a compressor which makes sounds more intelligible to a person hearing such sounds.

It is an additional object of this invention to provide a hearing aid that increases the intelligibility of sounds to a person having impaired hearing.

It is still an additional object of this invention to provide a hearing aid that increases the intelligibility of sounds to a person in a noisy area.

SUMMARY OF THE INVENTION

This invention resides in a volume control which compresses or expands waves applied thereto comprising a plurality of first filters connected to a source of waves, a respective power circuit connected to each first filter and a plurality of second filters, a second filter being connected to the output of each power circuit. The power circuits produce a wave whose amplitude is a power of the wave applied. If the power is less than one the wave is compressed. If the power is greater than one, the wave is expanded. If the power is one, there is no compression. Amplifiers may be included before the first filters or after the second filters or where desired. While there may be delay in the remainder of the circuit, such as in the filters, the power circuits operate essentially instantaneously. Since the change in amplitude takes place in the power circuits, it depends on the instantaneous amplitude of the wave being processed and not the amplitude of a previous wave or average of previous waves. Further, since a soft sound is compressed an amount depending on the amplitude of the soft sound, it will not be lost. In fact, since the root of a quantity less than one is greater than the quantity, a soft sound may be increased in amplitude by this invention. Still further, since the loud sounds are decreased to a root value thereof, the range of amplitudes of the sounds may be decreased in the inventive compressor. These two results are exclusive of the effects of pre- or post-amplification, i.e., a post amplification gain of $10^6$ would not allow soft sounds to become louder, but merely louder relative to the loud sounds.

BRIEF DESCRIPTION OF THE FIGURES

The invention will be better understood upon reading the following descriptions thereof in connection with the accompanying drawing in which:

FIG. 1 is a diagrammatic showing of a hearing aid including a volume control in accordance with this invention, FIG. 2 is a detailed showing of a power circuit that may be used in the hearing aid of FIG. 1, and FIG. 3 is a diagram that is useful in explaining the operation of the disclosed invention.

DETAILED DESCRIPTION

Turning first to FIG. 1, a microphone 10 feeds into an amplifier 12. The output of the amplifier 12 feeds into each of a plurality of first filters 14. As shown each filter 14 is a band pass filter and they each pass a different band of frequencies in the audio frenquency band. While three band pass filters 14 are shown, more of less thereof may be used. The dotted rectangle 14' indicates that more filters may be used if needed. The number of filters 14 and the band width that they pass is so chosen that the wave at the output of the hearing aid of FIG. 1 is a good replica of the wave applied at the microphone 10. The number needed is well known in the art. Each filter 14 is connected to its respective power circuit 16. Again, the power circuit 16' is provided to indicate more power circuits may be used if desired. Each power circuit 16 is connected to a respective second band pass filter 18 and a filter 18' is provided for the power circuit 16' if used. The second filters 18 are connected to an amplifier 20 in the input of which the output of the second filters 18 is summed. A wave which is a good compressed or expanded replica of the wave applied to the microphone 10 appears at the output of the amplifier 20 and at the output of the speaker 22. Both the microphone 10 and the speaker 22 are sound transducers. In operation, the first filters 14 divide the wave applied thereto into bands, the power circuit 16 changes the volume of the waves in the respective bands, incidently producing distortion such as waves which are the harmonics and the sums and differences of the frequencies of the waves applied thereto. The filters 18 pass the waves in the bank applied to the power circuit 16 and reject or do not pass the waves comprising the distortion, since the distortion waves are outside of the band passed by the respective filters 18. Any well known power circuit may be used for element 16.

Referring to FIG. 2, a power circuit that may be used as an element 16 of FIG. 1 is shown. The power circuit comprises an input terminal 23 to which the wave $V_1$ whose amplitude is to be changed is applied. An input resistor 24 is connected between the terminal 23 and the negative input terminal of an operative amplifier 26 which has a low offset voltage. The positive terminal of the operative amplifier (herein after "op amp") is grounded. Two oppositely directed diodes 28 and 30 are connected between the negative input terminal of the op amp 26 and its output terminal. An output resistor 32 is connected between the output terminal of the amplifier 26 and ground. The log of the input voltage $V_1$ appears across the resistor 32. The circuit between the terminal 23 and the junction of resistors 32 and 42 is therefore a log circuit.

An exponent (power or root) change circuit is connected to the output of the log circuit described. This power control circuit comprises an input resistor 42 connected between the output of the op amp 26 and the negative input of an op amp 44, which also has low offset voltage. The positive terminal of the op amp 44 is grounded. A variable resistor 46 is connected between the negative input and the output of the op amp 44. A load resistor 48 is connected between the output of the op amp 44 and ground. The output of the power changer appears across resistor 48 and its amplitude depends on the ratio of the resistors 46 and 42. For instance if the resistor 46 is twice the resistor 42, the amplitude of the wave across resistor 48 is twice the amplitude of the voltage across resistor 32 and if the resistor 46 is one half the resistor 42, the amplitude of the wave across the resistor 48 is one half the voltage across the resistor 32. The circuit between the junctions of resistors 32 and 42 and the junction of resistors 46 and 48 is therefore an adjustable amplifier circuit.

The output of the op amp 44 is connected to the emitter of the PNP transistor 34 and to the emitter of the NPN transistor 36 whose bases are connected to different constant voltages $VC_1$ and $VC_2$ respectively. The collectors of the two transistors 34 and 36 are connected together and to the negative input terminal of a low offset voltage op amp 38, its positive terminal being grounded. A feedback resistor 50 is connected between the output and the negative input of the op amp 38.

A voltage appears at the output terminal 40 of the op amp 38 that is a power or a root of the voltage $V_1$ applied to the input terminal 23 depending on the ratio of resistors 46 and 42. This output voltage at terminal 40 will be the square of the input voltage $V_1$ at terminal 23 if the ratio is two and will be the square root of the input voltage $V_1$ if this ratio is one half. Of course, higher or lower powers greater and one or less than one (or even unity) may be chosen. If the power is greater than one, the wave is expanded. If the power is less than one, the wave is compressed. The circuit between the junctions of the resistors 46 and 48 and the terminal 40 is therefore an antilog circuit.

To better understand the difference in compression provided by a known compressor and the present compressor consider the series of time sequential amplitudes 16, 9, 4, 1, and 15. Using a known compressor, and sequentially applying waves thereto, the waves having the amplitudes of the several terms of the series, the storage of the time sequential amplitude 16 would cause its reduction by some factor, one half, for example, and this same reduction would apply to each member of the series for several milliseconds. Now, using one half as the factor, the series becomes 8, 4 1/2, 2, 1/2, and 0.25 and the range of amplitudes which was previously 32 is now unchanged. Using the described compressor set to provide square roots, the series of amplitudes becomes 4, 3, 2, 1, and 7, and the range of amplitudes is decreased from 32 to the square root of 32 or about 5.6. It is noted that the large numbers are more greatly reduced than the small ones. Also contrary to the dynamic operation of known compressors, the term .5 has actually been increased to 0.7. The loud sounds are made softer and the soft sounds are made louder. This is true of both the disclosed compressor and known compressors for steady sounds, but this is only true of the inventive compressor for dynamic sounds, and particularly for a loud sound followed quickly by a soft sound. This feature of the disclosed compressor is particularly useful when announcing into a noisy area, where otherwise, the soft sounds may be lost. Furthermore, the plosive sounds are not deemphasized by the instant compressor. It is noted that the static or steady state properties of known compressors may be made quite similar to the inventive compressor, but their dynamic operation, since it depends upon the storage of previous amplitudes, is quite different. When the wave to be compressed by a known compressor does not vary in amplitude or varies so slowly that the amplitude of the wave to be compressed is only slightly changed in amplitude, it is considered that the known compressor is operating in static or steady state. Attention is called to FIG. 3 to assist in explaining the operation of the inventive compressor for a wave that changes rapidly in amplitude as compared to the known compressor.

FIG. 3 represents the envelope of a wave of sinuousoidal shape which is symmetrical about the center line 50. The amplitude of the wave is represented by the lines 52. The wave is suddenly increased in size to the size indicatd by the peaks 53. According to the instant invention the wave will be compressed to the lines 54 which includes the dotted portion 56 thereof as shown. This is because the compression of the wave is essentially instantaneous. In known compressors, since the compression is due to stored previous amplitudes, the wave takes the shape shown by the solid lines 58 and 54, that is the wave goes to the peak or nearly to the peak it would go to if there were no compression and then it goes down to its compressed value very quickly. Similarly, if the wave decreases suddenly from its size at lines 54, with the inventive compressor, the wave decreases to the amplitude shown by the lines 62 and 60. But when using known compressors, the wave that is suddenly decreased in amplitude takes the amplitude 64, 64 since it tends to decrease by the amount that the wave amplitude decreases and the compressor takes time to bring the wave amplitude up to its value 60.

There are persons having impaired hearing in which the impairment includes a threshold of hearing and a threshold of discomfort that are so close together that if a normal range of amplitudes of sounds are applied to such a person's ears, some sounds would be too low to be heard and other amplitudes of sounds would be so high as to cause the person discomfort or even pain. Using the instant compressor in a hearing aid for such a person the range of amplitudes of sounds may be kept within the range between the threshold of hearing and the threshold of discomfort by adjusting the rooter, and by adjustment of the amplifiers used in the hearing aid, the desired range of input sound amplitudes may be kept between the two thresholds. Such a person will be able to hear and understand what he hears better than if he used a hearing aid including conventional compressors.

In the recording art, a record can be overloaded by recording the loud sound at an amplitude such as that at which it is played, whereby two adjacent tracts on the record interfere with each other. It is customary to compress such loud sounds while recording and then expand them when reproducing the sound. Using the compressor and the expander of the present invention, the distortion inherent in known compressors and expanders may be greatly reduced.

What is claimed is:
1. An audio device comprising:
   a. a microphone,
   b. a first plurality of band pass filters coupled to the output of said microphone,
   c. a plurality of power circuits each power circuit being coupled to a respective band pass filter,
   d. each of said power circuits consisting of a log circuit, an amplifier and an antilog circuit connected in cascade,
   e. a second plurality of band pass filters coupled to respective power circuits,
   f. band pass filters of said first plurality of filters and of said second plurality of filters passing substantially the same frequency bands, and
   g. a sound transducer coupled to said second plurality of band pass filters.
2. The invention of claim 1 in which said power circuits provide a power of greater than one whereby said audio device is an expander.
3. The invention of claim 1 in which said power circuits provide a power of less than one whereby said audio device is a compressor.
4. A wave volume control comprising:
   a. a plurality of band-pass input filters to which a wave whose volume is to be controlled may be applied.
   b. a respective power circuit to the input of which the output of each said input filters is connected,
   c. each power circuit consisting of a log circuit, an amplifier, and an antilog circuit connected in cascade,
   d. a like plurality of band-pass output filters to the input of which the output of respective power circuits are connected, and
   e. said band pass input filters and said band pass output filters passing substantially the same bands of frequencies.

* * * * *